United States Patent [19]

Davies

[11] Patent Number: 4,568,891
[45] Date of Patent: Feb. 4, 1986

[54] R.F. OSCILLATOR ARRANGEMENT
[75] Inventor: Robert Davies, Copthorne, England
[73] Assignee: U.S. Philips Corporation, New York, N.Y.
[21] Appl. No.: 614,396
[22] Filed: May 25, 1984

Related U.S. Application Data
[63] Continuation of Ser. No. 259,263, Apr. 30, 1981, abandoned.

[30] Foreign Application Priority Data

May 9, 1980 [GB] United Kingdom ................ 8015503

[51] Int. Cl.⁴ ............................................. H03L 1/02
[52] U.S. Cl. .................................... 331/176; 331/70; 331/107 R
[58] Field of Search ............. 331/107 DP, 107 R, 176

[56] References Cited

U.S. PATENT DOCUMENTS 4,380,745 4/1983 Barlow et al. ................. 331/176
4,445,096 4/1984 Lee et al. ...................... 331/176

FOREIGN PATENT DOCUMENTS 0121708 9/1980 Japan ......................... 331/107 DP
0062406 4/1981 Japan ......................... 331/107 DP

OTHER PUBLICATIONS

Steel, B. et al., "Piecewise Linear Analog Temperature Compensation Scheme Using a Highly Interactive Electrically Programmable Read-Only Memory", Motorola Technical Disclosure Bulletin, v. 1, n. 1 (Aug. 80) pp. 29-30.

Primary Examiner—Eugene R. LaRoche
Assistant Examiner—Robert J. Pascal
Attorney, Agent, or Firm—Robert J. Kraus

[57] ABSTRACT

In an R.F. oscillator arrangement comprising a diode (D), such as a TRAPATT diode, operable to produce pulses of R.F. energy when d.c. pulses (P) above a critical level ($I_k$) are applied to the diode (D), the frequency of oscillation is markedly dependent on the temperature of the diode (D). To reduce variations of the frequency over a wide operating range of ambient temperatures a direct current ($I_a$) below the critical level ($I_k$) is passed through the diode (D) to heat it, the heating current ($I_a$) being controlled by measuring the temperature of a heat-sink (N) on which the diode (D) is mounted and which is substantially at ambient temperature, or by measuring the oscillating frequency.

5 Claims, 3 Drawing Figures

R.F. OSCILLATOR ARRANGEMENT

This is a continuation of application Ser. No. 259,263, filed Apr. 30, 1981, now abandoned.

BACKGROUND OF THE INVENTION

This invention relates to an R.F. oscillator arrangement comprising a diode operable to produce pulses of radio frequency energy when pulses of direct current greater than a critical current are applied to the diode, the radio frequency being dependent on the temperature of the diode.

The diode is suitably a TRAPATT diode.

Present theory and experience indicate that the TRAPATT mode is a large-signal mode that develops from a small-signal negative resistance. There is a critical bias current below which negligible, if any, microwave energy is generated. This critical current is high. A typical S-band p-n junction TRAPATT diode with a junction area of $4 \times 10^{-4}$ cm$^2$ has a critical bias current of about 1-2 amps when mounted in an oscillator circuit that is typically of the time-delay-triggered (T.D.T.) type, such as that described by W. J. Evans in "Circuits for high-efficiency avalanche-diode oscillators", I.E.E.E. Trans. MTT-17, 1060, (1969), or as described in U.K. patent applications Nos. 2026800 and 2032715 corresponding to U.S. Pat. Nos. 4,348,646 and 4,354,165, respectively.

In common with other oscillators the frequency of free running TRAPATT oscillators, varies with the diode and circuit temperatures which are of course functions of the ambient temperature. Both coaxial and microstrip S-band (about 2.5 GHz) TRAPATT oscillators have been tested by the applicant over wide temperature ranges, for example $-50°$ C. to $+100°$ C., and the frequency-temperature characteristic has been negative and typically approximately linear with a value of between about $-300$ kHz/°C. and $-400$ kHz/°C. for flip-chip diodes.

The temperature of the circuit affects the operating frequency because of the coefficient of linear expansion of the metal structure of the oscillator and the temperature dependence of the permitivity of any dielectric material in the delay-line associated with the T.D.T. circuit. Increasing temperature increases the length of the oscillator structure and generally increases the permitivity of dielectrics in the delay line such as polystyrene supports in a coaxial oscillator or the alumina substrate in a microstrip version; both of these effects cause the oscillation frequency to decrease with increasing temperature. However, the variation of frequency calculated from the temperature dependence of these parameters is considerably less than that observed in such oscillators (which is about $-300$ to $-400$ kHz/°C.).

The temperature of the diode device also determines the oscillation frequency. It is suggested that the effect of temperature on the device is such that, assuming a charging current that is independent of temperature, the time taken each R.F. cycle for the particle current to increase by avalanche multiplication to such a level that the displacement current is zero varies with diode temperature. The effect of this temperature dependence can be best appreciated by considering the device voltage-time characteristic. While the diode voltage is below the breakdown voltage the diode appears as a capacitor. Assuming the diode to be instantaneously biased below breakdown, a constant charging current will cause the voltage across the diode to increase linearly with time. As the voltage passes through breakdown and continues to increase with time, the number of charge-carriers in the depletion region starts to increase by avalanche multiplication. The voltage across the diode continues to increase until there are sufficient carriers to carry all the charging-current (at this point the displacement current is zero); the diode voltage has now reached a maximum from which it falls rapidly with the further increase in the number of carriers due to avalanche multiplication. (In a T.D.T. circuit, this collapse launches the trigger pulse into the delay-line circuit along which the pulse travels, the pulse polarity being inverted at a step transition and returning along the delay line to provide the next trigger. We have seen earlier that the circuit delay varies only slightly with temperature). The time between the diode voltage passing through breakdown and reaching a maximum varies with temperature considerably because of the ionization coefficients of holes and electrons, the saturated drift velocity and the saturation current; each of these parameters is a function of temperature, ionization and saturated drift velocity decreasing with increasing temperature while saturation current increases with increasing temperature. It is thought that the net negative frequency-temperature characteristic of TRAPATT diode oscillators is due to negative contributions from the ionization and saturated drift velocity and a positive contribution from the saturation current.

It has been proposed (see the published abstract of Japanese patent application No. 55-23628) to reduce the range of frequency variation of the pulse of a pulsed microwave oscillator by providing a temperature sensing element on the heat-sink of the oscillation element and using it to control the supply of electrical power to adjacent heating elements, the heat-sink and heating elements being mounted on a part made of thermal insulator; the ON and OFF set value of the temperature sensing element is selected slightly higher than the estimated ambient temperature. However, since the efficiency with which a direct current is converted to R.F. energy in a microwave oscillator is generally very much less than 100%, the production of a substantial amount of R.F. energy also involves the production of a substantial amount of heat which must be removed from the oscillation element to prevent it from becoming too hot. The above-mentioned arrangement has the major disadvantage that the thermal insulator inhibits the loss of heat from the oscillation element; very little heat can be produced in the oscillation element without its temperature rising considerably above the temperature at which the temperature sensing element is set to operate, thereby degrading performance, particularly the operating lifetime of the oscillation element. Moreover, if material of good thermal conductivity were to be used instead of the thermal insulator, a large amount of power would be required to maintain the heat-sink at the desired temperature when the ambient temperature was low. It may also be noted that a simple ON-OFF control of a heating current of fixed magnitude is not well suited to accurate maintenance of a preset temperature in conditions where the ambient temperature may vary over a wide range.

SUMMARY OF THE INVENTION

It is an object of the invention to provide an improved R.F. oscillator in which variations of the oscillating frequency with ambient temperature are reduced.

According to the invention, an R.F. oscillator arrangement as set forth in the opening paragraph is characterized in that the arrangement comprises means for passing a heating current less than the critical current through the diode and means for controlling said heating current so as to reduce variations of said frequency with ambient temperature.

The present invention is based on the recognition of the fact that if a pulsed R.F. oscillator, such as a TRAPATT oscillator, has a substantial critical current, a smaller current can be applied to the diode during the intervals between the pulses to heat the diode without generating any substantial microwave energy. This heating current (which may also be applied during the pulses) can be controlled to make the oscillation frequency substantially independent of ambient temperature by making the diode temperature substantially independent of ambient temperature.

Suitably, the diode is mounted on a heat-sink, which in operation is substantially at ambient temperature, and the controlling means comprises means for measuring the temperature of the heat-sink.

As an alternative, the controlling means may comprise means for measuring said frequency.

Preferably, the controlling means comprises means for varying the magnitude of the heating current.

Suitably, the diode is a TRAPATT diode.

BRIEF DESCRIPTION OF THE DRAWING

An embodiment of the invention will now be described by way of example with reference to the diagrammatic drawing in which.

DESCRIPTION OF THE PREFERRED EMBODIMENTS

Figure 1:
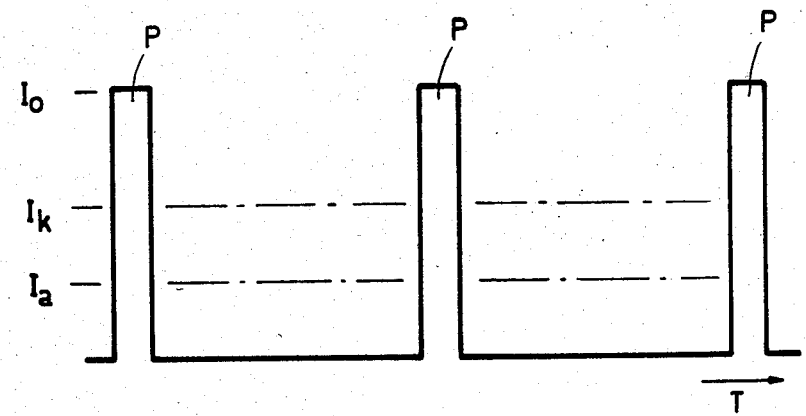
FIG. 1 is a graph of bias current against time.

FIG. 1 illustrates the usual bias pulses P which are applied to a pulsed TRAPATT oscillator. The amplitude of the pulses depends on the diode area and may be 4–5 amps. The current $I_k$ represents the critical current below which TRAPATT oscillations do not take place and $I_a$ represents a bias current which is less than the critical current $I_k$.

The invention utilizes the thermal resistance which inevitably exists between the diode and its surroundings (particularly because the active region of the diode is generally very small). The thermal resistance enables a small heating power to maintain a substantial difference in temperature between the diode and its surroundings when the ambient temperature is below its maximum, but does not require any additional thermal resistance, which would undesirably restrict the dissipation of heat generated as a consequence of the production of R.F. energy during the pulses.

Consider a TRAPATT diode chip that is mounted on a heat sink and that is being operated at constant mean R.F. power (for example, so as to obtain optimum efficiency).

The temperature $T_c$ of the diode chip is given approximately by the expression $$T_c = T_h + [R_\theta \cdot V_b \cdot I_a] + [R_\theta \cdot V_o \cdot I_o \cdot \delta \cdot (1-\eta)] \quad \text{(i)}$$

where $T_h$ is the temperature of the heat-sink, $R_\theta$ is the thermal resistance from the diode chip to the heat-sink, $V_b$ is the diode reverse breakdown voltage, $I_a$ is a bias current below critical bias $I_k$ $V_o$ is the diode mean voltage during oscillation pulses, $I_o$ is the diode mean current during oscillation pulses, $\delta$ is the duty cycle, and $\eta$ is the efficiency of the diode, expressed as a fraction.

We shall assume that the thermal resistance between the heat-sink and the surroundings is relatively small, so that the heat-sink is substantially at ambient temperature.

We shall take, for an S-band diode which is to operate with $T_h$ in the range $-40°$ C. to $+90°$ C., the following approximate figures:

$R_\theta$—20° C./Watt $V_b$—100 Volts $V_o$—70 Volts $I_o$—4 Amps $\delta$—0.1%

$\eta$—⅔

To find the lowest operable temperature of the diode, let $I_a$ be zero for $T_h = 90°$ C. Then $$T_c = 90 + [20 \times 70 \times 4 \times 10^{-3} \times \tfrac{1}{3}] = 90 + 4$$

approximately.

We can now determine the value of $I_a$ needed to maintain the chip temperature constant, by the expression $$T_c = 94° \text{ C.} = T_h + (R_\theta \cdot V_b \cdot I_a) + 4 \quad \text{(ii)}$$

and $$I_a = (90 - T_h)/(R_\theta \cdot V_b)$$
$$= (90 - T_h)/2000$$

This expression yields current $I_a$ of 35 mA for $T_h = 20°$ C. and 65 mA for $T_h = -40°$ C.: such currents are well below that necessary to initiate oscillations in the TRAPATT mode and if $I_a$ is plotted against $T_h$ the resultant graph is a straight line of negative slope.

Figure 3:
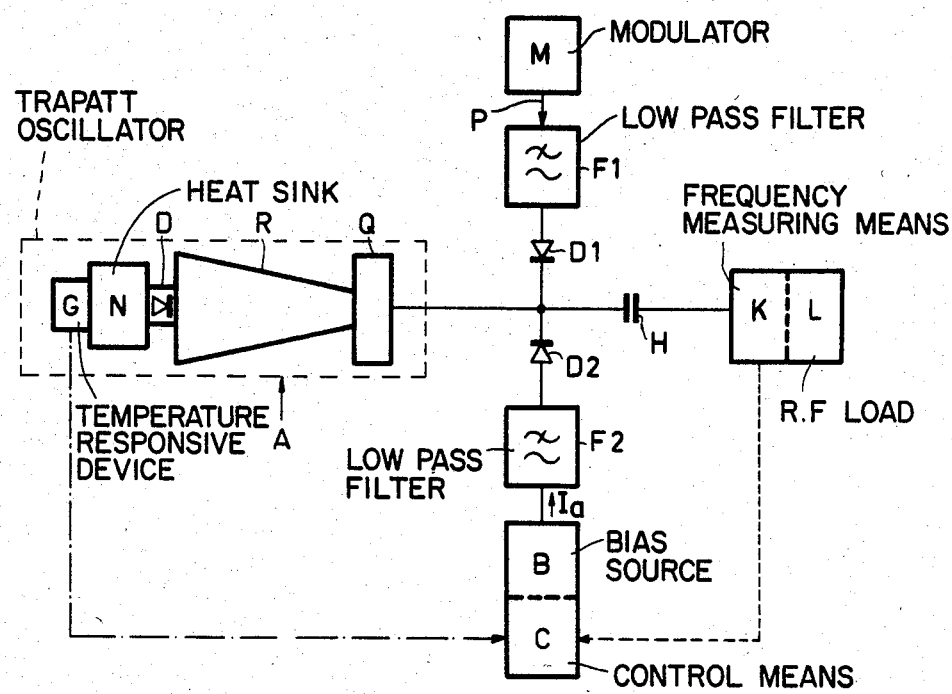
FIG. 3 illustrates an oscillator arrangement.

FIG. 3 illustrates an arrangement comprising a TRAPATT oscillator A controlled through the usual low-pass filter F1 and a diode D1 by a modulator M which produces d.c. pulses P as illustrated in FIG. 1. The oscillator A comprises an encapsulated TRAPATT diode D (with polarity as shown) mounted on a heat-sink N and feeding a tapered delay line R at the other end of which is a reflective step transition Q. In addition, a bias source B applies a continuous direct current $I_a$ less than the critical current for oscillation through a low-pass filter F2 and a diode D2 to the oscillator A, the source B controlled by control means C for controlling the magnitude of the current $I_a$. Frequency-measuring means K is coupled to the oscillator A via a capacitor H (to provide isolation from the direct currents) and in this case to a load L to absorb the R.F. power from the oscillator. The temperature of the heat-sink of the oscillator is measured by a temperature-responsive device G.

Figure 2:
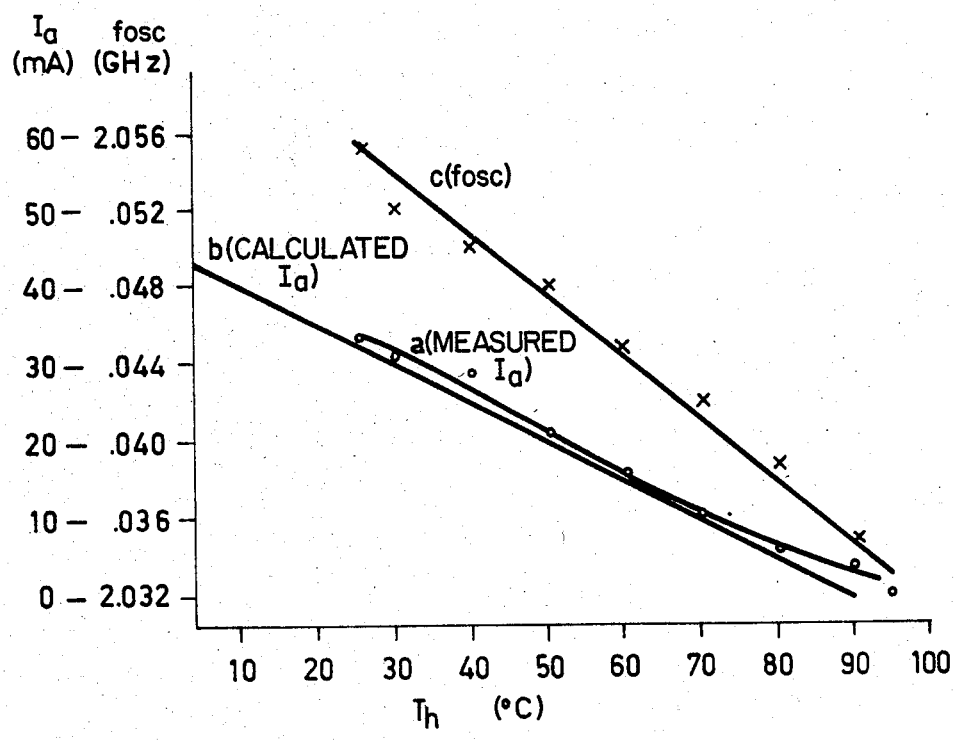
FIG. 2 illustrates variations of bias currents and frequency with temperature.

Using a particular diode with a junction area of $4 \times 10^{-4}$ cm$^2$ and with other parameters yielding equation (ii) above, measurements were made of the magnitudes of current $I_a$ necessary to maintain a constant frequency of 2.033 GHz at various heat-sink temperatures $T_h$. The currents needed at the various temperatures are shown at Table 1 and are illustrated in a in the graph of FIG. 2, while the straight line b in this graph represents expression (ii) above (both using the left-hand vertical scale).

Measurements were also made to show the frequency variations with $T_h$ in the absence of heating current $I_a$, and these results are shown in Table 2 and drawn at c in FIG. 3 (right-hand vertical scale).

In one embodiment of the invention, the control means C is coupled to the temperature-responsive device G as indicated by a dashed-dotted line in FIG. 3 so that the heating current $I_a$ is controlled to keep the temperature of the diode D substantially constant. In an alternative embodiment, the control means C is coupled to the frequency-measuring means K as indicated by a dashed line in FIG. 3 so that the heating current $I_a$ is controlled to keep the oscillation frequency substantially constant.

An oscillator arrangement embodying the present invention is especially superior to the arrangement described in the above-mentioned Japanese patent application for operation at high R.F. power levels and high ambient temperatures. Consider, for example, a TRAPATT diode with the following operating parameters:

$R_\theta$—7° C./Watt
$\delta$—2%
$\eta$—$\frac{1}{3}$.

If such a diode is operated to produce a peak R.F. power (i.e. the R.F. power during the pulses) of 250 Watts, the mean R.F. power is 5 Watts and the rate of production of heat due to the conversion of d.c. to R.F. is 10 Watts. Hence the temperature of the diode is approximately 70° C. above that of the heat-sink. If the diode is (as before) to operate over a range of ambient temperatures have an upper limit of 90° C. (for which the heating current $I_a$ is made zero), the temperature of the diode is approximately 160° C. The maximum temperature at which it can be operated if its operating life is not to be drastically shortened is not more than about 200° C. If thermal insulation between the heat-sink and the surroundings introduced an additional thermal resistance of only 7° C./Watt, an attempt to operate in these conditions would cause the diode temperature to exceed this maximum and hence would not be a practical possibility.

TABLE 1

| \multicolumn{2}{c}{frequency = f = 2.033 GHz} | |
|---|---|
| $T_h$ (°C.) | $I_a$ (mA) |
| 95 | 0 |
| 90 | 4 |
| 80 | 6.9 |
| 70 | 10.9 |
| 60 | 16.1 |
| 50 | 22 |
| 40 | 28.4 |
| 30 | 31.7 |
| 26 | 33.6 |

TABLE 2

| $T_h$ (°C.) | f (GHz) |
|---|---|
| 95 | 2.033 |
| 90 | 2.035 |
| 80 | 2.039 |
| 70 | 2.042 |

TABLE 2-continued

| $T_h$ (°C.) | f (GHz) |
|---|---|
| 60 | 2.045 |
| 50 | 2.048 |
| 40 | 2.050 |
| 30 | 2.052 |
| 26 | 2.055 |

I claim:

1. An RF oscillator arrangement comprising a current-controlled diode for producing pulses of radio frequency energy when direct current pulses of magnitude greater than a critical value are applied thereto, and circuit means coupled to the diode for applying said direct current pulses,
   characterized in that the arrangement includes frequency stabilizing means for passing through the diode a heating current of magnitude lower than the critical value to minimize variation of the pulse frequency with changes in the temperature of the diode, said frequency stabilizing means comprising:
   (a) sensing means for producing a signal which varies with said temperature changes,
   (b) a current bias source coupled to the diode for producing said heating current; and
   (c) control means coupled to the bias source and the sensing means for controlling the magnitude of the heating current produced by said bias source in response to the signal produced by said sensing means;
   where the diode is mounted on a heat-sink and where the sensing means comprises a temperature responsive device attached to said heat sink.

2. An RF oscillator arrangement comprising a current-controlled diode for producing pulses of radio frequency energy when direct current pulses of magnitude greater than a critical value are applied thereto, and circuit means coupled to the diode for applying said direct current pulses,
   characterized in that the arrangement includes frequency stabilizing means for passing through the diode a heating current of magnitude lower than the critical value to minimize variation of the pulse frequency with changes in the temperature of the diode, said frequency stabilizing means comprising:
   (a) sensing means for producing a signal which varies with said temperature changes,
   (b) a current bias source coupled to the diode for producing said heating current; and
   (c) control means coupled to the bias source and the sensing means for controlling the magnitude of the heating current produced by said bias source in response to the signal produced by said sensing means;
   where the sensing means comprises frequency measuring means electrically-connected to an output of said arrangement.

3. An arrangement as in claims 1 or 2 where the heating current produced by the bias source is a DC current.

4. An arrangement as in claims 1 or 2 where the diode is a TRAPATT diode.

5. An arrangement as in claim 4 comprising a time-delay-triggered TRAPATT oscillator where said circuit means includes a length of delay line connected in series with the diode and a trigger element in the form of a step transition from a high to a low impedance at an end of the delay line remote from the diode.

* * * * *